(12) United States Patent
Nazarian

(10) Patent No.: US 9,196,409 B2
(45) Date of Patent: Nov. 24, 2015

(54) INTEGRATED CIRCUIT INDUCTORS

(75) Inventor: Alexe Nazarian, Eindhoven (NL)

(73) Assignee: NXP, B. V., Eindhoven (NL)

( * ) Notice: Subject to any disclaimer, the term of this patent is extended or adjusted under 35 U.S.C. 154(b) by 0 days.

(21) Appl. No.: 13/991,616

(22) PCT Filed: Oct. 5, 2011

(86) PCT No.: PCT/IB2011/054389
§ 371 (c)(1),
(2), (4) Date: Jun. 4, 2013

(87) PCT Pub. No.: WO2012/076998
PCT Pub. Date: Jun. 14, 2012

(65) Prior Publication Data
US 2013/0257577 A1    Oct. 3, 2013

(30) Foreign Application Priority Data

Dec. 6, 2010 (EP) .................................. 10193825

(51) Int. Cl.
| | | |
|---|---|---|
| *H01F 5/00* | (2006.01) | |
| *H01F 27/06* | (2006.01) | |
| *H01F 27/30* | (2006.01) | |
| *H01F 27/28* | (2006.01) | |
| *H01F 17/00* | (2006.01) | |
| *H01F 27/34* | (2006.01) | |
| *H01F 41/04* | (2006.01) | |

(52) U.S. Cl.
CPC ............ *H01F 17/0006* (2013.01); *H01F 5/003* (2013.01); *H01F 17/0013* (2013.01); *H01F 27/2804* (2013.01); *H01F 27/34* (2013.01); *H01F 41/041* (2013.01); *H01F 2017/0073* (2013.01); *Y10T 29/49004* (2015.01)

(58) Field of Classification Search
USPC ................................... 336/200, 65, 232, 206
See application file for complete search history.

(56) References Cited

U.S. PATENT DOCUMENTS

| | | | | |
|---|---|---|---|---|
| 4,816,784 A | * | 3/1989 | Rabjohn | 333/24 R |
| 6,577,219 B2 | * | 6/2003 | Visser | 336/200 |
| 6,798,326 B2 | * | 9/2004 | Iida | 336/200 |
| 6,891,444 B2 | * | 5/2005 | Jacobsson et al. | 331/117 R |
| 6,894,598 B2 | * | 5/2005 | Heima | 336/200 |
| 6,927,664 B2 | * | 8/2005 | Nakatani et al. | 336/200 |
| 7,151,430 B2 | * | 12/2006 | Mattsson | 336/200 |
| 7,312,683 B1 | * | 12/2007 | Lee | 336/200 |
| 7,420,452 B1 | * | 9/2008 | Lee et al. | 336/200 |
| 7,642,891 B2 | * | 1/2010 | Einzinger et al. | 336/226 |
| 2004/0075521 A1 | * | 4/2004 | Yu et al. | 336/200 |

(Continued)

FOREIGN PATENT DOCUMENTS

| | | |
|---|---|---|
| EP | 2 337 038 A1 | 6/2011 |
| WO | 98/05048 | 2/1998 |
| WO | 2004/012213 A1 | 2/2004 |
| WO | 2005/096328 A1 | 10/2005 |

(Continued)

OTHER PUBLICATIONS

International Search Report for Patent Appln. No. PCT/IB2011/054389 (Feb. 27, 2012).

*Primary Examiner* — Elvin G Enad
*Assistant Examiner* — Kazi Hossain

(57) ABSTRACT

In order to reduce the inter-path capacitance of an inductor, an integrated circuit inductor design is provided in which the path crossings are designed such that the voltage differences between the adjacent paths in the loops are (in total) minimized.

14 Claims, 6 Drawing Sheets

(56) References Cited

U.S. PATENT DOCUMENTS

2005/0237144 A1* 10/2005 Einzinger et al. ............. 336/200
2008/0284552 A1* 11/2008 Lim et al. ...................... 336/200

FOREIGN PATENT DOCUMENTS

| WO | 2006/105184 A1 | 10/2006 |
| WO | 2009/101565 A1 | 8/2009 |

* cited by examiner

INTEGRATED CIRCUIT INDUCTORS

This invention relates to integrated circuit inductors formed using a conductive track.

Integrated circuit inductors are essential to realize the voltage-controlled oscillators needed in many fully integrated transceiver chips serving a multitude of wireless communication protocols. These are being provided to the market today. The required inductance value is typically a few nH, and should be adjustable to the application, whereas the quality factor should be as high as possible. An additional benefit of an integrated circuit inductor is a low net magnetic field, resulting in a lower magnetic coupling to other inductors.

It is well known to form inductors using multiple loops, and with multiple paths per loop. The conductive track is preferably provided on two levels with cross overs between paths of the track, the paths changing between the two levels at some of all of the cross overs.

The invention relates particularly to figure of eight layouts (i.e. having two loops) or clover-shaped layouts (i.e. having four loops). Substantially symmetrical inductors, with figure of eight or clover shaped structures, are well known. The symmetrical design enables the inductor to be used in common and differential mode.

Many known designs attempt to reduce undesired magnetic field effects.

For example (as one of many examples), WO2005/096328 A1 describes a method and system for reducing mutual electromagnetic coupling between VCO resonators and for implementing the same on a single semiconductor chip. The method and system involve using inductors that are substantially symmetrical about their horizontal and/or their vertical axes and providing current to the inductors in a way so that the resulting magnetic field components tend to cancel each other by virtue of the symmetry. In addition, two such inductors may be placed near each other and oriented in a way so that the induced current in the second inductor due to the magnetic field originating from first inductor is significantly reduced. The inductors may be of various forms.

Known designs which provide a lower magnetic coupling can result in a smaller quality factor of the inductor. One of the reasons for a reduced quality factor is an increased number of crossing points.

Each crossing point gives an additional contribution to the resistance of an inductor. In order to make a crossing point, at least two conducting layers are used. Through the length of the inductor (excluding the crossing points), all of the loop-shaped conducting layers are preferably connected in parallel using vias. This reduces the sheet resistance of the conducting material. If two or more resistive materials are connected in parallel then the total resistance of the construction is smaller than the resistance of each parallel-connected component. However, in order to make a crossing point between two turns, each turn must use only one layer. This leads to an increase of sheet resistance for the parts of an inductor where such crossings are implemented. As a result, the total resistance of the inductor increases.

Each crossing point contributes also to the capacitance between windings or coils due to potential difference between the different paths at the crossing point.

The influence of the crossing points is known to be an area of interest in obtaining desired performance in such inductor arrangements. It is for example known to minimise the number of crossing points. By keeping the number of crossings points at a minimum, the quality factor of an inductor is increased. This approach is disclosed in WO2009/101565.

One of the main characteristic of an inductor is its resonance frequency $$\omega = \frac{1}{\sqrt{LC}} \tag{1}$$

here L is self inductance of an inductor and C is the parasitic capacitance. As can be seen from this formula, minimization of the parasitic capacitance leads to an increase of resonance frequency.

Another characteristic of an inductor is its Quality factor (Q-factor):

$$Q = \frac{\omega L}{R} \tag{2}$$

here R is the internal resistance of the inductor.

From equation (2), it can be seen that the Q-factor of an inductor is linked to the resonance frequency $\omega$, such that an inductor having a higher resonant frequency also tends to have a higher Q-factor. This is why an increase of the resonance frequency leads to improvement of the quality factor.

The parasitic capacitance of an integrated inductor on a chip has two major contributions: capacitance between the inductor track and substrate and capacitance between different turns of the inductor. The capacitance between different turns of the inductor is dependent on the voltage difference between adjacent turns as well as the physical proximity of those turns.

The invention aims to balance the different requirements of the inductor to achieve high resonance frequency without decreasing the self inductance.

According to the invention, there is provided an inductor comprising a conducting track arranged in loops, each loop comprising at least two concentric paths, wherein the track length comprises tap regions at the ends of the tracks and a central track region which comprises the concentric paths of the loops, wherein the central track region comprises a sequence of track sections, each comprising a loop half turn, and crossings between tracks sections, with the crossings spaced along the central track region by one or two track sections, wherein the central track section has a parameter p defined as:

p=the sum of squares of normalised differences in track section sequence number for all adjacent pairs of track sections in each loop, wherein the path crossings are at locations such that the parameter p is the minimum possible value of p.

This design enables the parasitic capacitance between turns of substantially symmetrical figure of eight and clover shaped inductors to be minimised without changing the self inductance.

The track can comprise a figure of eight with two concentric paths in each loop, and p=¼.

In this design, there can be two crossings, one at the top and one at the bottom of the figure of eight shape.

In another design, the track comprises a figure of eight with three concentric paths in each loop, and p=⅝.

In this design, there can be four crossings, one at the top and one at the bottom of the figure of eight shape between the outermost pair of concentric paths, and two at the crossing area, one between the innermost pair of concentric paths in one loop and one between the innermost pair of concentric paths in the other loop.

In another design, the track comprises a clover shape with three concentric paths in each loop, and p=4/9.

In this design, the track can comprise two figure of eight shapes side by side, and each figure of eight shape has five crossings, one at the top and one at the bottom of the figure of eight shape between the outermost pair of concentric paths, and three at the crossing area, between the adjacent pairs of concentric paths.

The invention also provides a method of designing the layout of an inductor comprising a conducting track arranged in loops, each loop comprising at least two concentric paths, wherein the track length comprises tap regions at the ends of the tracks and a central track region which comprises the concentric paths of the loops, wherein the central track region comprises a sequence of track sections, each comprising a loop half turn, and crossings between tracks sections, with the crossings spaced along the central track region by one or two track sections, wherein the method comprises defining a parameter p:

p=the sum of squares of normalised differences in track section sequence number for all adjacent pairs of track sections in each loop; and selecting the path crossings at locations such that the parameter p is the minimum possible value of p.

Examples of the invention will now be described in detail with reference to the accompanying drawings, in which.

The invention provides an inductor design in which the path crossings are designed such that the voltage differences between the adjacent paths are (in total) minimised. This has the effect of reducing the capacitance between turns and also reducing the parasitic capacitances introduced by crossings between those adjacent turns.

As mentioned above, the inductors need a substantially symmetric layout, for example in order to be used as a differential negative resistance oscillator.

Figure 1A:
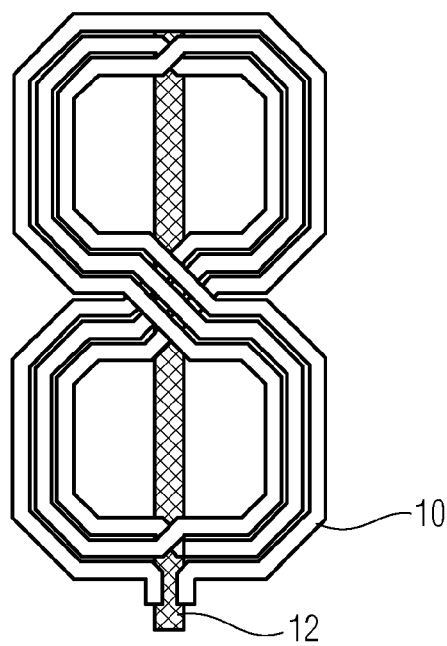
FIG. 1 shows two known symmetric inductors.
Figure 1B:
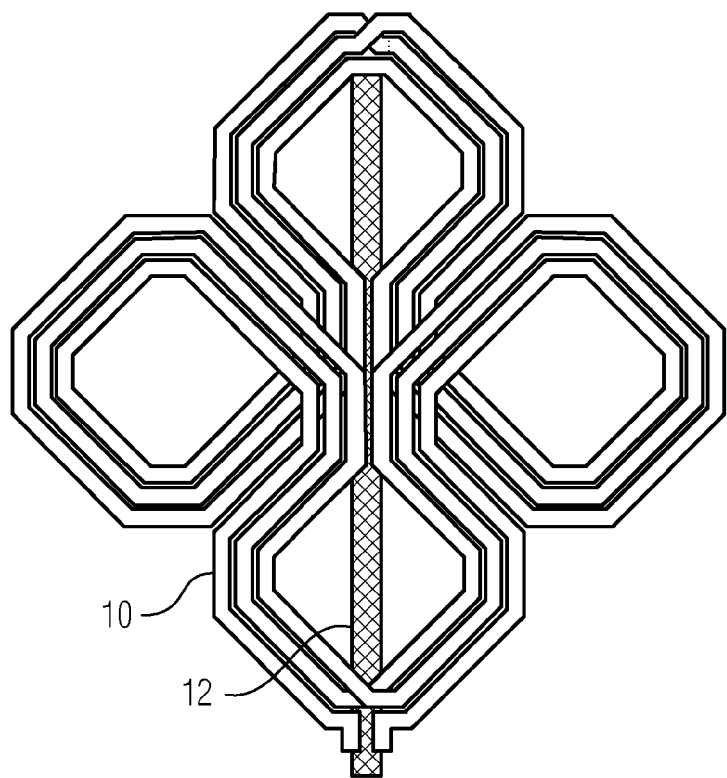

FIG. 1 shows two known symmetric inductors. FIG. 1A shows a figure of eight shape and FIG. 1B shows a clover shape.

In FIG. 1A, there are two loops, and each loop has three paths. The track 10 follows a figure of eight shape three times in series. The centre tap is shown as 12.

The centre tap is a metal layer beneath the metal layers of the inductor track. It connects using vias to the inductor track—for example to the centre point of the track. In common mode, a potential difference is applied to the terminals and to the centre tap.

In FIG. 1B, there are four loops, and each loop has three paths. The track 10 follows the clover shape three times in series. The centre tap is again shown as 12.

In FIGS. 1A and 1B, the central point of the inductive path is at the top of the structure, and this is where electrical connection is made to the centre tap 12.

Figure 2A:
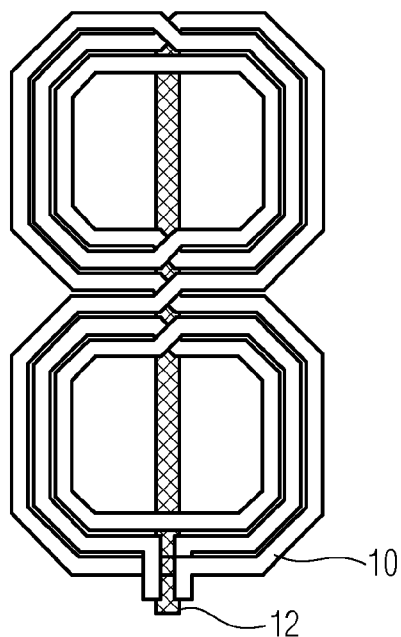
FIG. 2 shows two known symmetric inductors as disclosed in WO2009/101565.
Figure 2B:
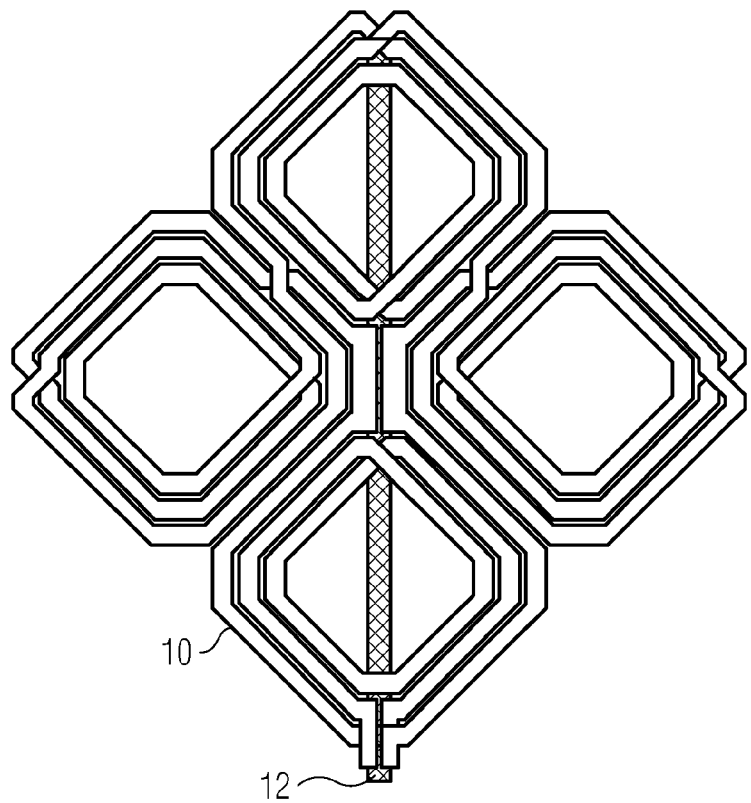

FIG. 2 shows two known symmetric inductors as disclosed in WO2009/101565. FIG. 2A again shows a figure of eight shape and FIG. 2B shows a clover shape.

In FIG. 2A, there are two loops, and each loop has three paths. Starting from the right hand tap, the track 10 passes from the centre tap at the bottom to the upper loop, then follows three turns of the upper loop, then completes the last 2.5 turns of the bottom loop.

In FIG. 2B, there are four loops, and each loop has three paths. Starting from the right hand tap, the track 10 completes three turns of the four loops, loop by loop (anticlockwise).

These designs reduce the number of crossing points, and each crossing is only between two tracks rather than between multiple tracks as in FIG. 1.

Figure 3:
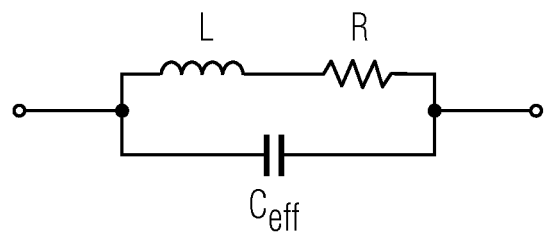
FIG. 3 shows a circuit from which the resonance frequency can be represented.

An inductor at frequencies smaller than the resonance frequency can be represented by the equivalent network shown in FIG. 3. Ceff is the effective capacitance. Ceff essentially comprises the effective capacitance to the substrate, to the ground shield, and the capacitance between turns.

For a given technological process, the effective capacitance between turns of an inductor depends on the distance between turns, the length of the turns and the average potential difference between turns. The length of the turns is proportional to the outer diameter of the inductor. This means that by decreasing the length of an inductor, the self inductance is decreased. An increase of the distance between turns also leads to a decrease of the self inductance of an inductor. Thus, altering the geometrical layout to reduce the parasitic capacitance will result in an undesirable reduction in self-inductance.

Figure 4:
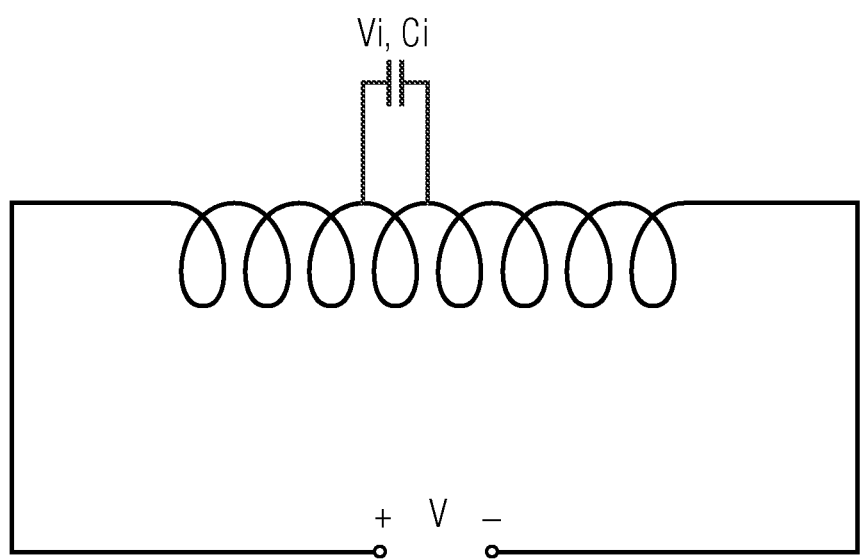
FIG. 4 shows a model by which the total parasitic capacitance for an inductor can be calculated.

FIG. 4 shows a model by which the total parasitic capacitance for an inductor resulting from parasitic capacitance between the inductor turns can be calculated.

Different turns of the inductor have different potential difference and different capacitance between each other that contribute to the effective parasitic capacitance.

An inductor having a voltage V applied across its terminals, and having a number of turns n, has a total parasitic capacitance which can be approximated by:

$$C_{\mathit{eff}} = \sum_i 1/2 V_i^2 C_i \qquad (3)$$

where Vi is the average voltage between the ith pair of adjacent inductor turns, and Ci is the intrinsic capacitance between the ith pair of adjacent inductor turns. Thus, by reducing the potential difference between turns, the effective parasitic capacitance can be reduced.

The invention thus provides designs which aim to reduce this effective capacitance, by designing the inductor path (in particular the crossing locations) such that the order of the turns is such that the voltage differences (squared) in total are minimised. Because the crossings are between adjacent tracks, this reduction of voltage between adjacent tracks not only reduces the parasitic capacitance between the turns (this parasitic capacitance being in the plane of the turns i.e. parallel to the substrate) it also reduces the parasitic capacitance of the cross overs (this cross over capacitance being in the layer stacking direction, i.e. perpendicular to the substrate).

FIG. 5 shows examples of figure of eight configurations, with reduced potential difference between turns at the cross over locations and therefore reduced effective capacitance between turns.

In all examples of the invention, the inductor comprises a conducting track 10 arranged in loops, each loop comprising at least two concentric paths. The track length comprises tap regions at the ends of the tracks and a central track region which comprises the concentric paths of the loops.

There are crossings between paths along the central region. As explained further below, the design is based on the central track region design and in particular the choice of the loop crossings, not the tap design, since various tap design layouts are possible.

A detailed analysis of the effective parasitic capacitance will require an integration, for example a parameter I:

$$I = \int |V1 - V2|^2$$

where V1 and V2 are the voltages on two adjacent tracks at the two locations where the tracks are side-by side. It can be assumed that approximately the track voltage decreases linearly from one end of the track to the other (although this does not take account of the changes in resistance at the cross overs). Thus, this parameter can be simplified by considering the distance from one end of the track to the locations:

$$I' = \int |d1 - d2|^2$$

The integration is for all locations where there are side-by-side track pairs, so that all of the track-to-track parasitic capacitances are calculated.

The invention aims to minimise this parameter.

However, it is possible to model the track in a more simple manner than suggested by the integral equation above, by virtue of the symmetry of the layout. In particular, the crossings are arranged symmetrically (with respect to orthogonal reflection axes). In addition, the number of crossings should be kept small. This means that in practice the crossings are all aligned or are aligned in groups, along symmetry axes of the structure. In the case of a figure of eight layout, the crossings are aligned along the central upright axis of the figure of eight shape as in FIG. 1A and FIG. 2A. In the case of a clover shape layout, the invention is preferably implemented as two side-by-side figure of eight layouts.

This means that in practice, the layouts have crossings every half loop/turn or every full loop/turn of the inductor track.

This means that the effective parasitic capacitance can be approximated based on a summation of the contribution of each half turn of the inductor track, since there is a step change each half turn or full turn. Of course, this simplification disregards the fact that different loops have different length (as a result of their different diameter) and that there are some parts of the track which will not be counted, such as the tap region, but also any interconnecting track sections which are not part of the loops.

To define the invention, the central track section is defined as having a parameter p:

p=the sum of squares of normalised differences in track section sequence number for all adjacent pairs of track sections in each loop.

The central track region is considered as comprising a sequence of track sections, each comprising a loop half turn, and crossings between tracks sections. The crossings are spaced along the central track region by one or two track sections. The track section sequence number represents how far the track section is from one of the taps.

Figure 5A:
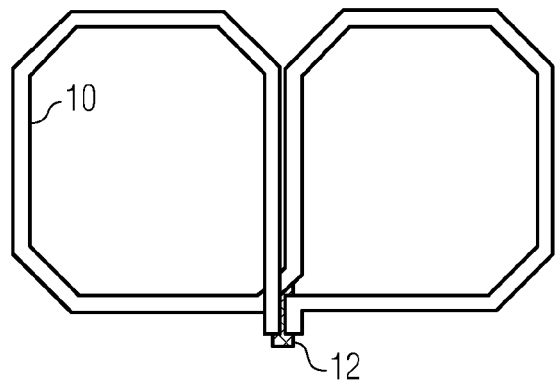
FIG. 5 shows examples of figure of eight configurations of the invention.

FIG. 5A shows a figure of eight shape with only one path per loop. In this case there are no adjacent track section sequence numbers.

Figure 5B:
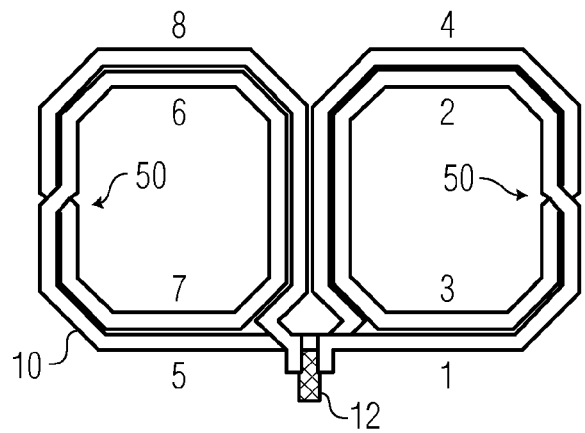

FIG. 5B shows a design in accordance with the invention with two paths per loop. In this design, there are two crossings, one 50 at the top and one 52 at the bottom of the figure of eight shape.

The parameter p can be obtained by counting the half turns from one end of the track to the other.

FIG. 5B shows this half turn count.

In FIG. 5B, there are 8 half turns in total, thus eight sequential track sections.

The right loop has a lower half with adjacent track sections 1 and 3 and a top half with adjacent track sections 2 and 4.

The left loop has a lower half with adjacent track sections 5 and 7 and a top half with adjacent track sections 6 and 8.

This means the parameter p=¼:

$$p = \left(\frac{3-1}{8}\right)^2 + \left(\frac{4-2}{8}\right)^2 + \left(\frac{7-5}{8}\right)^2 + \left(\frac{8-6}{8}\right)^2 = \frac{1}{4}$$

As is clear from the calculation above, the "normalised" differences in track section sequence number refer to the difference in sequence number divided by the total number of track sections.

The tail area is between the loops to provide the desired symmetry.

In the example of FIG. 5B, the tail area has two crossings which also contribute to the total capacitance. The two additional crossings are between the two ends of the track and the mid-point.

Thus, the track in this example of the invention comprises a figure of eight with two paths per loop and p=¼.

It is noted that the capacitance between loops is ignored for this parameter, as it only relates to the adjacent track sections in the loops. Thus, the parasitic capacitance between track sections 4 and 8 is ignored, as this is only around one quarter of a loop. In view of the discrete possible positions for the cross overs, this does not change the resulting cross over positions to minimise the value of p.

Figure 5C:
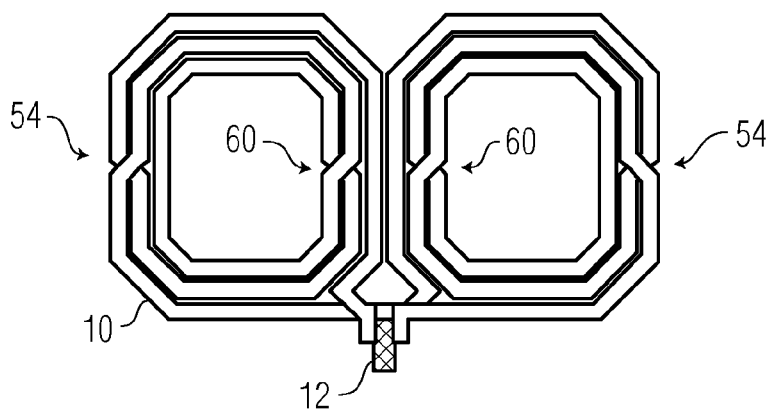

FIG. 5C shows a design with three paths per loop. In this design, there are four crossings, one 54 at the top and one 56 at the bottom of the figure of eight shape between the outermost pair of concentric paths, and two at the crossing area, one 58 between the innermost pair of concentric paths in one loop and one 60 between the innermost pair of concentric paths in the other loop.

Using the same approach as explained above for FIG. 5B, there are 12 half turns in total. Each loop has 4 sets of adjacent pairs of track sections.

The right loop has a lower half with adjacent track sections 1 and 5 and 5 and 3, and a top half with adjacent track sections 2 and 4 and 2 and 6.

The left loop has a lower half with adjacent track sections 7 and 11 and 9 and 11, and a top half with adjacent track sections 10 and 8 and 10 and 12.

This means the parameter p=5/9:

$$p = 4\left(\left(\frac{2}{12}\right)^2 + \left(\frac{4}{12}\right)^2\right) = \frac{5}{9}$$

The tail area is again between the loops to provide the desired symmetry, and again comprises two additional crossings between the two ends of the track and the mid-point.

Thus, the track in this example of the invention comprises a figure of eight with three paths per loop and p=5/9.

The inductors of FIGS. 5B and 5C have the same self inductance as the inductors of FIGS. 2A and 2B.

Generally, for a figure of eight track, $p=(n-1)(2n-1)/6n$ for n paths per loop.

Figure 6:
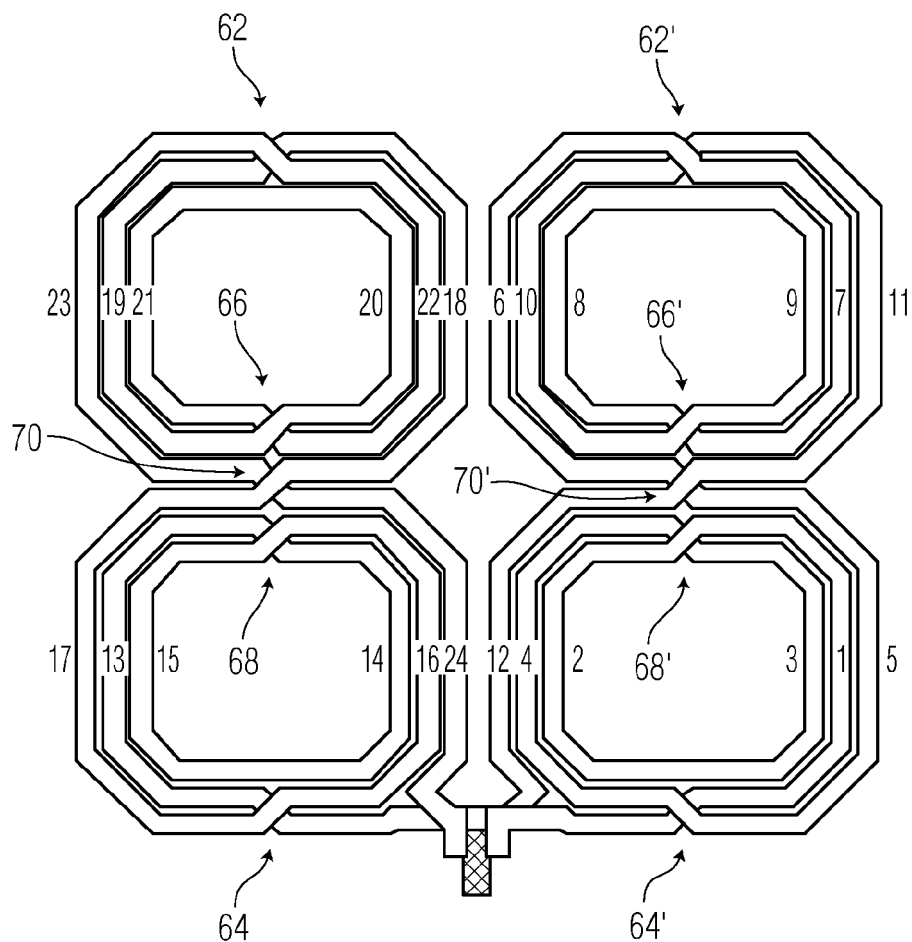
FIG. 6 shows an example of the invention for a clover shape inductor.

FIG. 6 shows an example of the invention for a clover shape track with three concentric paths in each loop.

The track comprises two figure of eight shapes side by side, and each figure of eight shape has five crossings, one 62 at the top and one 64 at the bottom of the figure of eight shape between the outermost pair of concentric paths, and three 66, 68, 70 at the crossing area, between the adjacent pairs of concentric paths. The crossings for the right figure of eight are labelled as 62' to 70'.

Again, using the same approach as explained above, there are 24 half turns in total. The design can be seen as two side-by-side figure of eight shapes. The track section between the centre tap location and the cross overs 64 are ignored, as these sections are considered not part of the loops—they are instead sections simply joining the two figure of eight shapes together. The track section numbers are shown in FIG. 6.

For the right figure of eight:
The bottom loop has adjacent track sections 1 and 3, 1 and 5, 2 and 4, 4 and 12.
The top loop has adjacent track sections 9 and 7, 7 and 11, 8 and 10, 6 and 10.

For the left figure of eight:
The bottom loop has adjacent track sections 13 and 17, 13 and 15, 14 and 16, 16 and 24.
The top loop has adjacent track sections 19 and 21, 19 and 23, 20 and 22, 22 and 18.

Thus, the track in this example of the invention comprises a clover shape with three paths per loop and $p=4/9$ ($256/24^2$).

Generally, for a clover shaped track, $p=(2n^2-3n+7)/12n$ for n paths per loop. Thus, for two paths per loop in a clover layout, $p=3/8$.

In FIGS. 5 and 6, the connection of the centre tap to the inductor track is to the centre of the track.

There are many different ways to implement the crossing points at the location of the centre tap 12.

Figure 7:
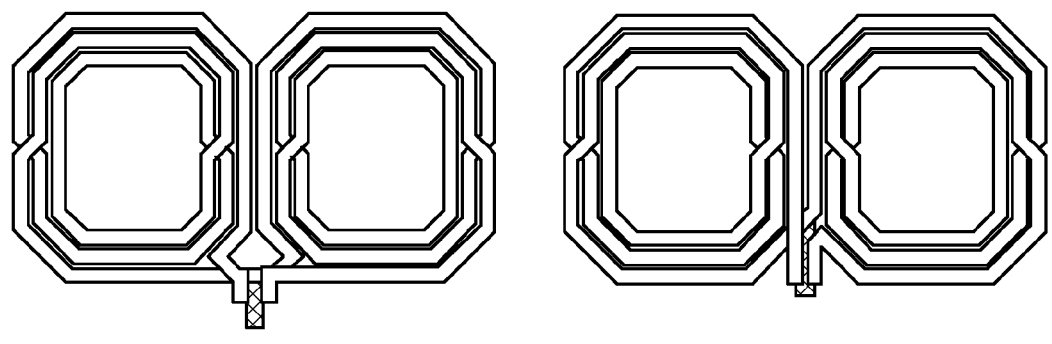
FIG. 7 shows two possible designs of centre tap connection for figure of eight designs with three paths per loop.
Figure 8:
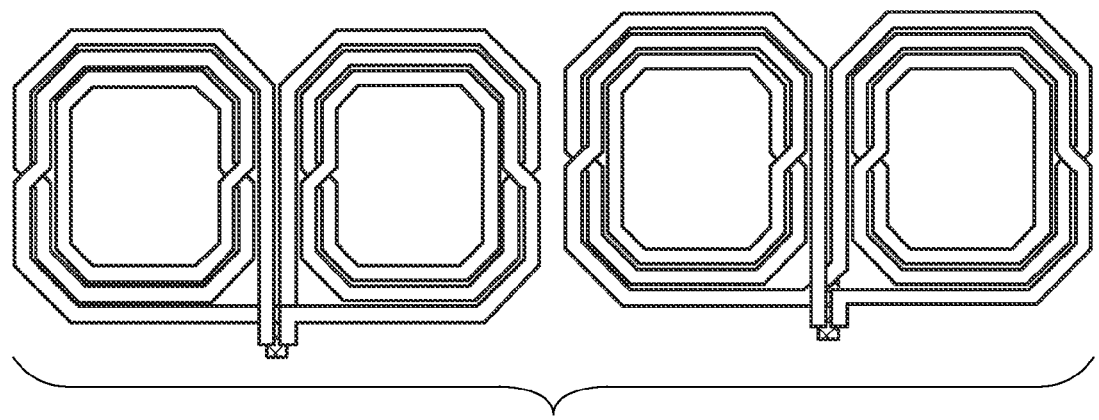
FIG. 8 shows two further possible designs of centre tap connection for figure of eight designs with three paths per loop.

FIGS. 7 and 8 show four possible designs of centre tap connection for figure of eight designs with three paths per loop.

FIGS. 7 and 8 show that slightly different designs can give rise to one or two crossings at the tap location. When there are two crossings, they are between the two ends of the track and the mid-point. When there is one crossing, it is between one end of the track and the mid-point.

The designs of crossing points at the location where centre tap is connected as shown in FIGS. 7 and 8 can be applied to the clover shape inductors.

Figure 9:
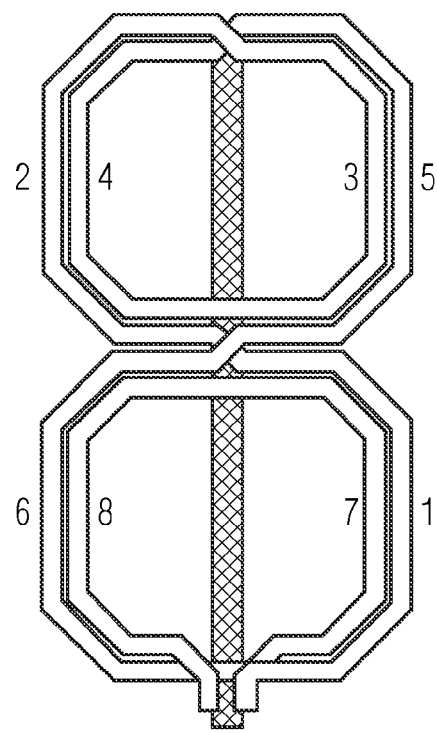
FIG. 9 shows the approach of counting half applied to a prior art example.

FIG. 9 shows a known design based on the approach in WO2009/101565 (of completing the top loop before returning to the bottom loop).

In this case, $p=48/64=3/4$.

A further advantage of the design of FIG. 5B compared to FIG. 9 is that the feed lines do not couple magnetically with the rest of the inductor when it is used in common mode as opposed to the design of FIG. 9. This means that the point where central tap is connected is a middle point of the inductor not only from the resistance but also from the inductance point of view.

The same logic applied to the prior art of FIG. 1 shows that this design has even higher capacitance between turns.

In the designs of the invention, there are crossings only between two tracks rather than between multiple tracks as in FIG. 1.

The main aim of the invention is to minimise the loop-to-loop parasitic capacitances. As explained above, a further benefit is that the cross over parasitic capacitance is also reduced.

The invention allows building inductors of low magnetic stray field with high resonance frequency. The invention is especially relevant for multiple turn inductors. Proposed layouts are substantially symmetric and therefore can be used not only in differential but also in the common mode.

As mentioned above, the inductance is typically in the nH range, such as 1 nH to 60 nH. The inductor track typically has a width in the range 0.5 µm to 50 µm.

The inductor track is formed of aluminium or copper for example. They can be formed as part of a CMOS or QUBIC process.

Other variations to the disclosed embodiments can be understood and effected by those skilled in the art in practicing the claimed invention, from a study of the drawings, the disclosure, and the appended claims. In the claims, the word "comprising" does not exclude other elements or steps, and the indefinite article "a" or "an" does not exclude a plurality. The mere fact that certain measures are recited in mutually different dependent claims does not indicate that a combination of these measured cannot be used to advantage. Any reference signs in the claims should not be construed as limiting the scope.

The invention claimed is:

1. An inductor comprising:
a conducting track arranged in two loops that form a figure of eight shape, each loop comprising at least two concentric paths, wherein the track length comprises tap regions at the ends of the tracks and a central track region which comprises the concentric paths of the loops, wherein the central track region comprises a sequence of track sections, each comprising a loop half turn, and crossings between tracks sections, with the crossings spaced along the central track region by one or two track sections, wherein the central track section has a parameter p defined as:
p=the sum of squares of normalised differences in track section sequence number for all adjacent pairs of track sections in each loop,
wherein the path crossings are at locations such that the parameter p is the minimum possible value of p.

2. An inductor as claimed in claim 1, comprising n concentric paths per loop, and $p=(n-1)(2n-1)/6n$.

3. An inductor as claimed in claim 2, wherein the track comprises two concentric paths in each of the two loops, and $p=1/4$.

4. An inductor as claimed in claim 3, wherein there are two crossings, one at the top and one at the bottom of the figure of eight shape.

5. An inductor as claimed in claim 3, wherein a tap area is provided symmetrically between the two loops.

6. An inductor as claimed in claim 2, wherein the track comprises three concentric paths in each loop, and $p=5/9$.

7. An inductor as claimed in claim 6, wherein there are four crossings, one at the top and one at the bottom of the figure of eight shape between the outermost pair of concentric paths, and two at the crossing area, one between the innermost pair of concentric paths in one loop and one between the innermost pair of concentric paths in the other loop.

8. An inductor as claimed in claim 6, wherein a tap area is provided symmetrically between the two loops.

9. An inductor as claimed in claim 1, wherein one loop of the figure of eight shape comprises a first consecutive set of said sequence of track sections and the other loop of the figure of eight shape comprises a second consecutive set of said sequence of track sections.

10. An inductor as claimed in claim 9, wherein the first consecutive set of said sequence of track sections and the second consecutive set of said sequence of track sections are non-overlapping.

11. An inductor as claimed in claim 1, wherein the midpoint of the central track region is between the two loops of the figure of eight shape.

12. An inductor as claimed in claim 11, wherein a centre tap is connected to the central track region at the midpoint of the central track region.

13. An inductor as claimed in claim 1, wherein the two loops of the figure of eight shape are horizontally distributed.

14. An inductor as claimed in claim 1, wherein one loop of the figure of eight shape comprises a first consecutive set of said sequence of track sections and the other loop of the figure of eight shape comprises a second consecutive set of said sequence of track sections;
   wherein the first consecutive set of said sequence of track sections and the second consecutive set of said sequence of track sections are non-overlapping;
   wherein the midpoint of the central track region is between the two loops of the figure of eight shape; and
   wherein a centre tap is connected to the central track region at the midpoint of the central track region.

\* \* \* \* \*